US009391708B2

(12) United States Patent
Fincato et al.

(10) Patent No.: US 9,391,708 B2
(45) Date of Patent: Jul. 12, 2016

(54) MULTI-SUBSTRATE ELECTRO-OPTICAL INTERCONNECTION SYSTEM

(71) Applicant: STMICROELECTRONICS S.r.l., Agrate Brianza (MB) (IT)

(72) Inventors: Antonio Fincato, Cameri (IT); Salvatore Mario Rotolo, Milan (IT); Enrico Stefano Temporiti Milani, Pavia (IT); Maurizio Zuffada, Milan (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/714,582

(22) Filed: May 18, 2015

(65) Prior Publication Data
US 2015/0341119 A1    Nov. 26, 2015

(30) Foreign Application Priority Data

May 21, 2014   (IT) .............................. MI2014A0932

(51) Int. Cl.
| H04B 10/00 | (2013.01) |
| H04B 10/40 | (2013.01) |
| H04B 10/70 | (2013.01) |
| H04B 10/50 | (2013.01) |
| H05K 3/30 | (2006.01) |
| H04B 10/80 | (2013.01) |

(52) U.S. Cl.
CPC ............. *H04B 10/40* (2013.01); *H04B 10/503* (2013.01); *H04B 10/70* (2013.01); *H04B 10/801* (2013.01); *H05K 3/30* (2013.01); *Y10T 29/49131* (2015.01)

(58) Field of Classification Search
CPC ...... H04B 10/40; H04B 10/503; H04B 10/70; H04B 10/801; H04B 10/43; Y10T 29/49131; H01L 2224/97; H01L 2223/6611; H01L 2223/6627
USPC .......................... 398/135–139, 140, 141, 164
See application file for complete search history.

(56) References Cited

U.S. PATENT DOCUMENTS

| 6,947,672 | B2 * | 9/2005 | Jiang .................... H04B 10/801 398/135 |
| 7,110,629 | B2 * | 9/2006 | Bjorkman ................ G02B 6/12 385/14 |
| 7,373,033 | B2 * | 5/2008 | Lu .......................... G02B 6/421 257/432 |

(Continued)

FOREIGN PATENT DOCUMENTS

EP   2 639 978    9/2013

OTHER PUBLICATIONS

Arakawa et al. "Silicon Photonics for Next Generation System Integration Platform" IEEE Communications Magazine; Mar. 2013' pp. 72-77.
Boeuf et al. "A Multi-wavelength 3D-compatible Silicon Photonics Platform on 300 mm SOI wafers for 25 Gb/s Applications" IEEE International Electron Devices Meeting (IEDM) Dec. 9, 2013. 4 pgs.
David A.B. Miller "Device Requirements for Optical Interconnects to Silicon Chips" Proceedings of the IEEE. vol. 97, No. 7. Jul. 2009. pp. 1166-1185.
Shigeru Nakagawa "High Density Optical Multi-Chip Module on Waveguide-integrated Carrier" 18th Optoelectronics and Communications Conference Held Jointly with 2013 International Conference on Photonics in Switching (OECC/PS) IEICE Jun. 30, 2013; 2 pgs.
Narasimha et al. "An Ultra Low Power CMOS Photonics Technology Platform for H/S Optoelectronic Transceivers at less than $1 per Gbps" optical Fiber communications (OFC) collocated National Fiber Optic Engineers Conference: Mar. 21, 2010; 3 pgs.
Guido Chiaretti "Towards the Industrial Deployment of Silicon Photonics Technology" IEEE Bipolar BICMOS Circuits and Technology Meeting (BCTM) Sep. 30, 2013; pp. 135-142.

*Primary Examiner* — Hibret Woldekidan
(74) *Attorney, Agent, or Firm* — Allen, Dyer, Doppelt, Milbrath & Gilchrist, P.A.

(57) ABSTRACT

An intra-board chip-to-chip optical communications system has a high bit rate and high data throughput based on the use of a silicon photonic interposer. The system includes a multi-substrate electro-optical structure for communications with CMOS and/or BiCMOS IC chips of a PCB. The structure includes a multi-chip module primary substrate mounted over the supporting PCB. The multi-chip module primary substrate implements high frequency electrical interconnections between transceiver circuit chips, mounted on the silicon photonic interposer, and the IC chips.

18 Claims, 4 Drawing Sheets

(56) References Cited

U.S. PATENT DOCUMENTS

| | | | | |
|---|---|---|---|---|
| 8,019,225 B2* | 9/2011 | Daghighian | H04B 10/40 | 398/135 |
| 8,168,939 B2* | 5/2012 | Mack | G02B 6/34 | 250/225 |
| 8,280,207 B2* | 10/2012 | Pinguet | G02B 6/124 | 385/15 |
| 8,412,052 B2* | 4/2013 | Mohammed | G02B 6/4249 | 385/52 |
| 8,831,437 B2* | 9/2014 | Dobbelaere | H01L 21/84 | 398/138 |
| 9,099,965 B2* | 8/2015 | Zuffada | H03F 1/223 | |
| 9,225,422 B1* | 12/2015 | Nagarajan | H04B 10/2575 | |
| 9,263,621 B2* | 2/2016 | Vreman | H01L 31/02005 | |
| 2009/0022500 A1* | 1/2009 | Pinguet | G02B 6/1228 | 398/164 |
| 2014/0270629 A1* | 9/2014 | Dutt | G02B 6/43 | 385/14 |
| 2014/0369693 A1* | 12/2014 | Peterson | H01L 21/84 | 398/138 |
| 2016/0036550 A1* | 2/2016 | Welch | G02B 6/4215 | 398/87 |

* cited by examiner

MULTI-SUBSTRATE ELECTRO-OPTICAL INTERCONNECTION SYSTEM

TECHNICAL FIELD

The present invention relates in general to intra-board, chip-to-chip and to inter-board communications, at high bit rates and high data throughputs, using electro-optical interfacing and optical data communications.

BACKGROUND

Increasing bandwidth requirements is becoming hard to meet because of electrical signal attenuation and crosstalk through radiated electromagnetic energy while equalization, coding, and shielding techniques developed to preserve the quality of metal connections may require considerable power and complexity while showing poor scalability.

Optical communications is considered an alternative to copper links as well as for intra-board chip-to-chip communications and high performance data processing (re: "Silicon Photonics for Next Generation System Integration Platform", Yasuhiko Arakawa, Takahiro Nakamura, Yutaka Urino and Tomoyuki Fujita, IEEE Communications Magazine, March 2013).

EP 2639978-A1 discloses a method and a system of data communications for an electro-optical board for data processing and communications based on the use of a silicon photonic interposer between a support PCB and a plurality of electronic chips mounted onto the optical interposer. This is with ordinary techniques using a hybrid integration of photonics and electronics by face-to-face bonding (flip-chip assembly). An array of optical I/O fibers is connected to waveguides defined in the silicon interposer. Through silicon vias (TSV) created in the photonic interposer provide the electrical path to/from the PCB substrate and the optoelectronic devices inside the silicon photonics die. The optical transmission is inside the silicon photonics die. Although somewhat of a higher parasitic phenomena may generally need to be accounted for at photonic and electronic device interfaces (e.g., Cu pillars and Pi pads), a great technological relief of separating photonics and electronics processes is achieved through such a hybrid integration approach.

The article "A Multi-wavelength 3D-compatible Silicon Photonics platform on 300 mm SOI wafers for 25 Gb/s Applications", F. Boeuf et al., IEDM13, pages 353-356, reports developments of hybrid integration of silicon photonics. In particular, a 3D assembly of a photonic IC bottom die (PIC) is based on an SOI substrate with an optimized buried oxide (BOX) thickness for insertion loss minimization of grating couplers used to couple light in and out of optical I/O fibers, and companion electronics top die or dies (EIC). This may avoid the technological complications of full monolithic integration (interactions at processing level) and attendant limitation of access by system designers to state-of-the-art CMOS and BiCMOS technologies.

However, even such a hybrid architecture may fall short of efficiently resolving important technical problems in many situations because of several drawbacks and limitations. In particular, the number of usable electronic dies (ICs) may be limited by the maximum area of a single silicon photonic chip that depends on the overall dimensions of a CMOS mask (commonly about 800 mm$^2$). Large size, thin silicon photonic interposers with dense populations of through silicon vias defined therethrough are delicate to handle and assemble onto a PCB. Heat dissipation requirements of the electronic dies (ICs) limit proximity to optics and are often too high to host the electronic dies close to a laser diode array chip. Optoelectronic components integrated in silicon photonic dies may suffer from high sensitivity to large temperature variations, and thermal management may impose complex control circuitry and expensive packaging arrangements. The presence of large ICs bonded onto the silicon photonic interposer may limit optical interconnectivity underneath them.

SUMMARY

The drawbacks of known architectures of electro-optical multi-chip interconnection systems are overcome or significantly alleviated by arranging the dissipative electronic chips (ICs) side-by-side alongside or around a photonic waveguide fabric silicon die, onto which are mounted integrated transceiver circuit dies.

The transceiver circuit of each electronic die may be electrically coupled to a respective one of the dissipative signal processing and control IC chips. The coupling may be through a multi-chip module primary substrate of electrical interconnection for the IC chips with the respective transceiver circuit dies mounted on the photonic waveguide fabric silicon die, interposed between the photonic waveguide fabric silicon die as well as some or all the dissipative electronic chips (ICs), and the underlying printed circuit board (PCB). Some or all of the dedicated transceiver circuits may alternatively be grouped in a reduced number of electronic dies or even in a single die to be mounted over the photonic silicon die.

Thus, a number of electronic chips of the board may be interconnected with each other through different physical substrates, namely through the PCB and through at least a multi-chip module primary substrate of electrical interconnection, according to a design hierarchy based on the type of signals, bit-rate, density of electrical lanes and distance. The multi-chip module of primary substrate of electrical interconnection may be silicon, for example, a structured silicon wafer, or many other dielectric matrix materials of relatively lower cost, such as different types of thermo setting resins, glasses, ceramics and others. Typically, these dielectric materials are used to fabricate multi-layer substrates with many purposely defined metal layers, with up to sixteen levels.

The photonic waveguide fabric silicon die mounted over the multi-chip module substrate of electrical interconnection may support a number of optical links dedicated to very high speed data transmission (e.g., above 10 Gbps). Generally, the optical links may be point-to-point between electro-optical I/Os, forming a mesh network in the photonic silicon die. However, other networking topologies may alternatively be implemented, according to design requisites or choices (e.g., optical tree, optical ring, optical star or other common topologies). The photonic waveguide fabric silicon die may have defined therein waveguides and other passive and active optical and electro-optical devices, such as modulators, photodetectors, optical splitters/combiners, optical taps and grating couplers. These devices are for performing optical modulation, photo-detection, optical signal distribution, optical power delivery and optical monitoring, optical I/O interfaces for high-speed data transfer and optical input means for a continuous wave (CW) laser light from an external source. The external source may be, for example, via an optical fiber and grating coupler, or via an edge-coupling or any other equivalent optical coupling.

The waveguides integrated in the photonic waveguide fabric silicon die may also realize, through optical I/O fibers coupled to the die, optical links for implementing inter-board communications among integrated circuit chips (ICs) present on different printed circuit boards (PCB) of the electronic system.

The electrical transceiver dies, atop the photonic waveguide fabric silicon die, may normally integrate, through standard BiCMOS and CMOS fabrication processes, analog and digital control circuits, modulator driver circuits, trans-impedance and limiting amplifiers (TIAs and LAs). These electronic circuits for optical/electrical interfacing may be coupled respectively with the optical modulators and photo-detectors integrated in the photonic waveguide fabric silicon die. The coupling is preferably through copper pillars of a three-dimensional (3D) assembly (i.e., according to a technique of hybrid integration by flip-chip bonding of the electronic integrated circuit (EIC) dies, upside down, onto the independently fabricated photonic integrated circuit die (PIC)), or alternatively, according to common bumps bonding techniques, through metal vias, surface pads and thermally re-flown micro solder bumps.

Fundamentally, the electrical transceiver dies atop the photonic waveguide fabric silicon die may interconnect with the electronic chips (ICs) through the multi-chip module primary substrate of electrical interconnection that hosts them. The substrate may be interposed between the photonic waveguide fabric silicon die and the underlying PCB, along fast electrical signal lanes of minimized length. The interposed module of primary substrate of electrical interconnection for a number of ICs may support intermediate data rate links on electrical tracks up to about 10 Gbps.

The interposed, multi-chip module primary substrate advantageously promotes an effective thermal separation of the optical communication links defined in the photonic waveguide fabric silicon die from signal processing and control electronic ICs, often of considerable size and highly dissipative, hosted on the module. Heat removal implementations and the overall heat management sub-system are greatly simplified, overcoming the criticalness and limitations of prior art architectures.

BRIEF DESCRIPTION OF THE DRAWINGS

The novel features, aspects and advantages of this invention, as well as details of illustrated exemplary embodiments thereof will be more fully understood from the ensuing description in connection with the drawings.

DETAILED DESCRIPTION OF EXEMPLARY EMBODIMENTS

Figure 1:
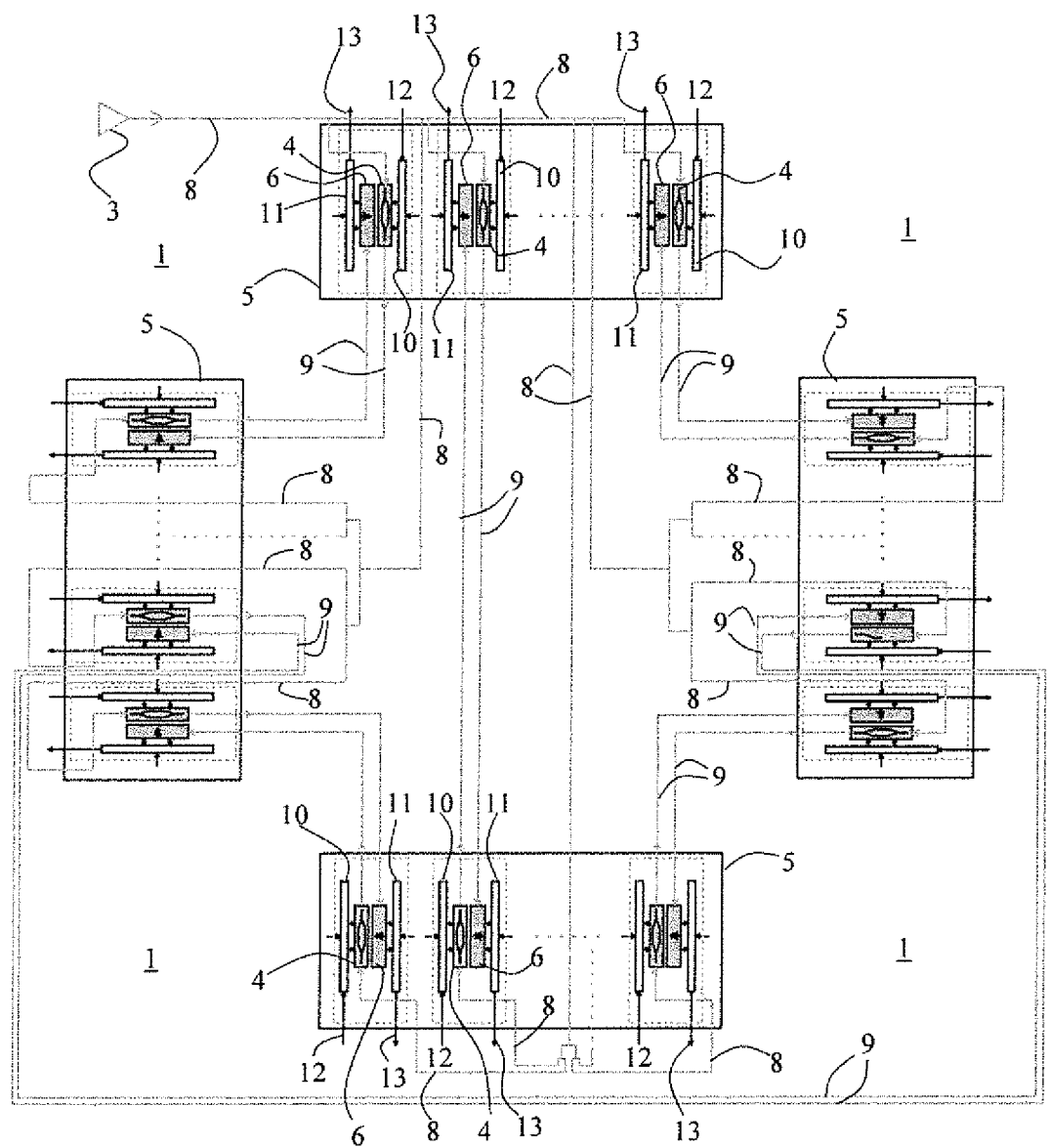
FIG. 1 is a general circuit diagram of an embodiment of an electro-optical multi-substrate, multi-chip interconnection system for intra-board, chip-to-chip, communications with an optical waveguide fabric layout without crossings.

With reference to FIG. 1, according to a first exemplary embodiment of the interconnection system of this disclosure, the interconnection structure uses a photonic waveguide fabric die 1 of optical interconnections that is generally coupled to at least one or to a plurality of integrated transceiver circuit dies 5, four for the example shown, mounted on top of the photonic waveguide fabric die 1. The mounting is generally in a peripheral position close to the edges of the die 1.

The silicon photonic fabric die 1 may comprise an SOI substrate similar to the one described in the cited article "A Multi-wavelength 3D-compatible Silicon Photonics platform on 300 mm SOI wafers for 25 Gb/s Applications", F. Boeuf et al., IEDM13, pages 353-356. The contents of this article are incorporated by express reference herein.

Optical modulation devices 4 may be Mach-Zender interferometers (MZI), ring resonators (RR) or Electro-Absorption (EA) modulators, and photonic detection devices 6. These devices are generally photo detector diodes, and are realized in the photonic waveguide fabric die 1 under the footprints of the integrated transceiver circuit dies 5 to electrically couple with drivers and amplification circuits of a corresponding integrated transceiver circuit die 5, upon mounting it atop the photonic waveguide fabric die 1.

A number of single mode or multimode silicon trench waveguides (MMWs) 8 and 9 are also defined in the silicon photonic fabric die 1. The waveguides are for distributing a continuous wave (CW) laser light to the modulation devices 6 and for carrying the modulated optical signals, output by the modulators 4 of intra-board, chip-to-chip communications among CMOS and/or BiCMOS integrated circuit system chips hosted on a multi-chip module of primary substrate 14.

According to the embodiment shown, the waveguides 8 that distribute a continuous wave (CW) laser light from an on-board or remote source, injected through an input fiber and a grating coupler (or edge coupling) 3 to the optical modulating devices (MZI) 4, as well as the waveguides 9 carrying modulated optical signals, do not cross. Alternatively, the layout of the waveguides may cross according to common practice physical geometries of silicon photonic waveguide fabrics.

The network of waveguides 9 carrying modulated optical signals defined in the silicon photonic fabric die 1 may also form dedicated optical links with optical I/O fibers that may be optically coupled to the photonic waveguide fabric silicon die 1. This is for implementing inter-board communications among integrated circuit chips (ICn) that may be present on different printed circuit boards (PCB) of the electronic system.

Figure 2:
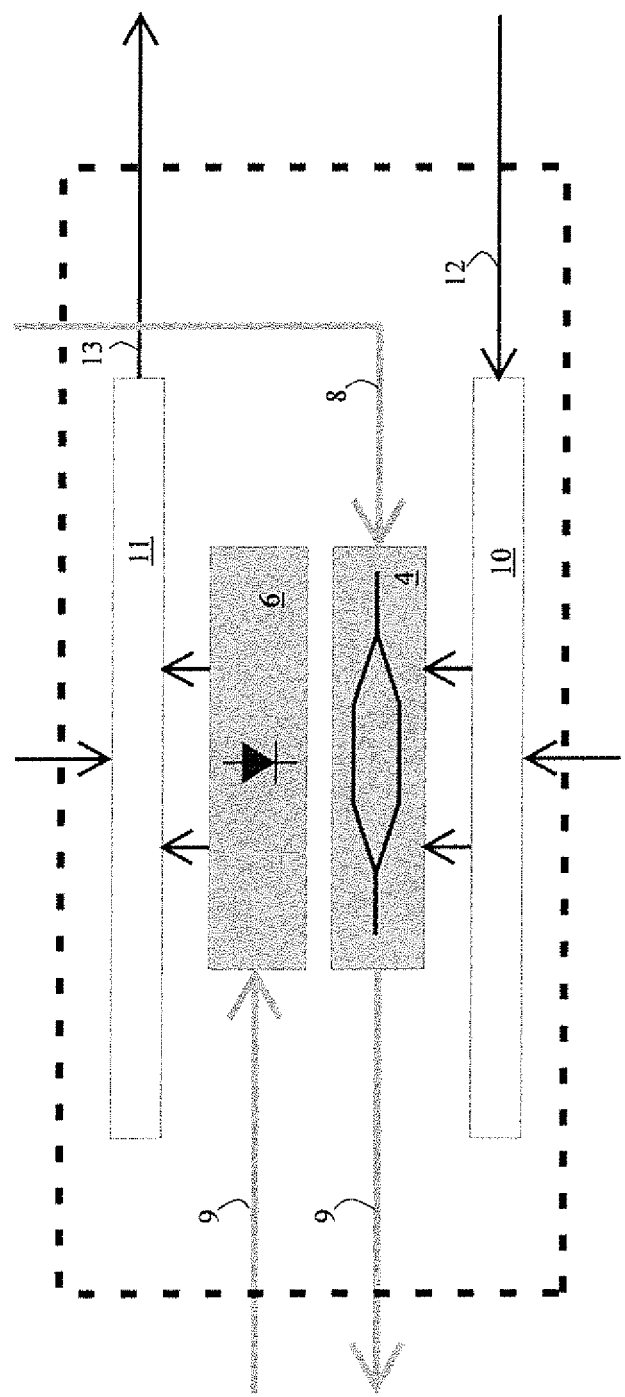
FIG. 2 shows the general layout scheme of a transceiver circuit module of integration in a multi-module electrical transceivers die, correlated to optical modulation and photo detection structures realized in the photonic waveguide fabric silicon die underneath.

As schematically depicted in FIG. 2, each transceiver circuit die 5 may generally include several identical integrated circuit modules M. Each module defines pairs of a driver circuit 10 and a trans-impedance amplifier circuit 11, respectively, for a modulation device 4 and a photo detector diode 6 present in the photonic waveguide fabric die 1, to which they electrically couple, upon mounting the transceiver die 5 onto the photonic waveguide fabric die 1. Signal input lines 12 and output lines 13 of the pairs of the integrated circuit modules M of the transceiver circuit dies 5 are metal strip lines defined over the surface photonic waveguide fabric die 1 that extends as far as the nearby edge of the die. This provides pads adapted for wire bonding.

Figure 3:
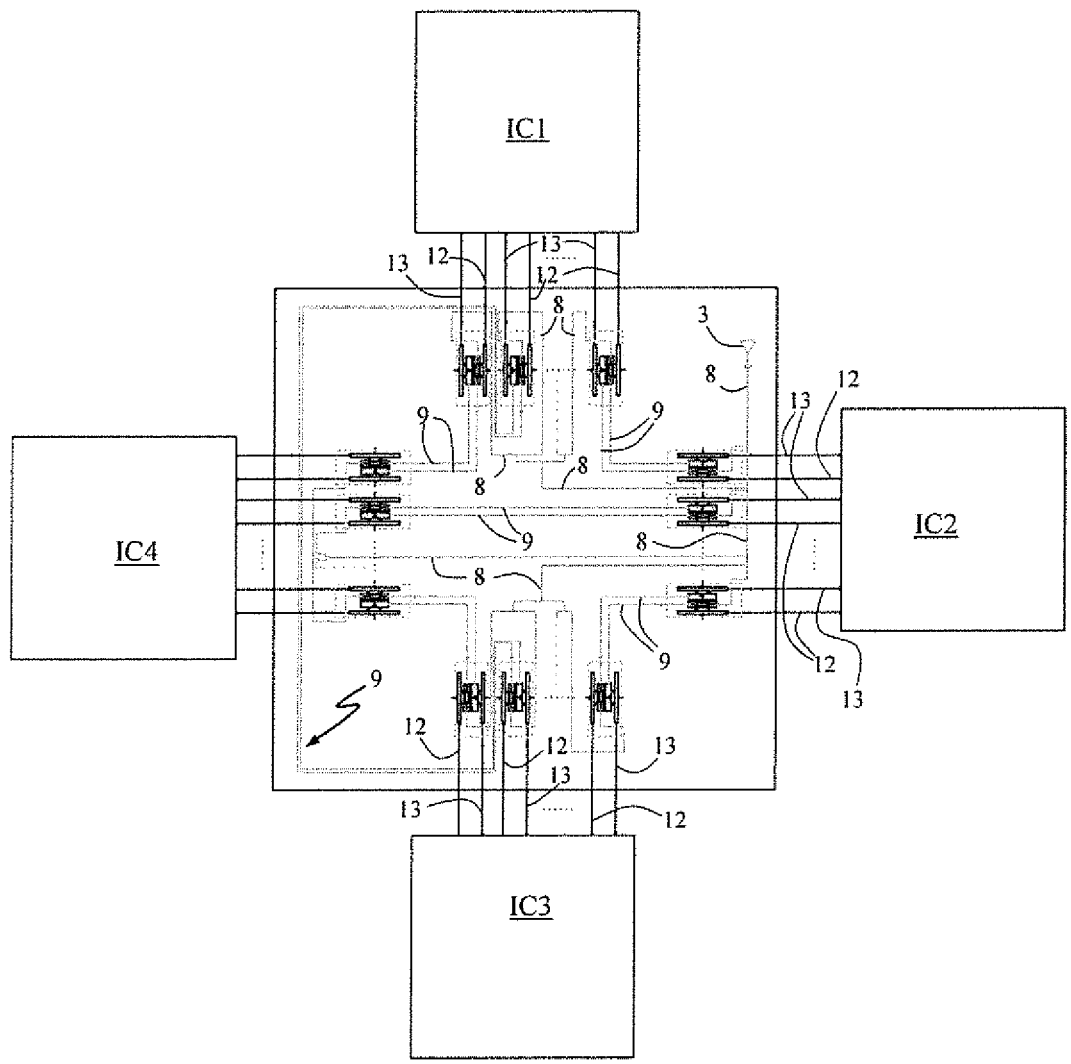
FIG. 3 shows an exemplary scheme of an interconnection, for intra-board, chip-to-chip communications, among four ICs through a multi-chip module primary substrate of electrical interconnection, interposed between the photonic waveguide fabric silicon die and the supporting printed circuit board.

As schematically depicted in FIG. 3, generally dissipative CMOS and/or BiCMOS integrated circuit system chips IC1, 1C2, . . . , 1Cn are arranged onto the surface of a multi-chip module 14 of primary substrate, side-by-side (i.e., juxtaposed) along the sides of the silicon photonic fabric die 1. That is, the chips are at a relatively small separation distance, and the high frequency signal I/O bottom metal pads are arranged in a peripheral row, extending along the side of the IC chip facing toward the nearby silicon photonic die 1. This is for shortening the electrical connection paths toward the metal strip lines 12 and 13 of the transceiver circuit dies 5, as better illustrated in cross-sectional views of the multi-substrate architecture.

Figure 4:
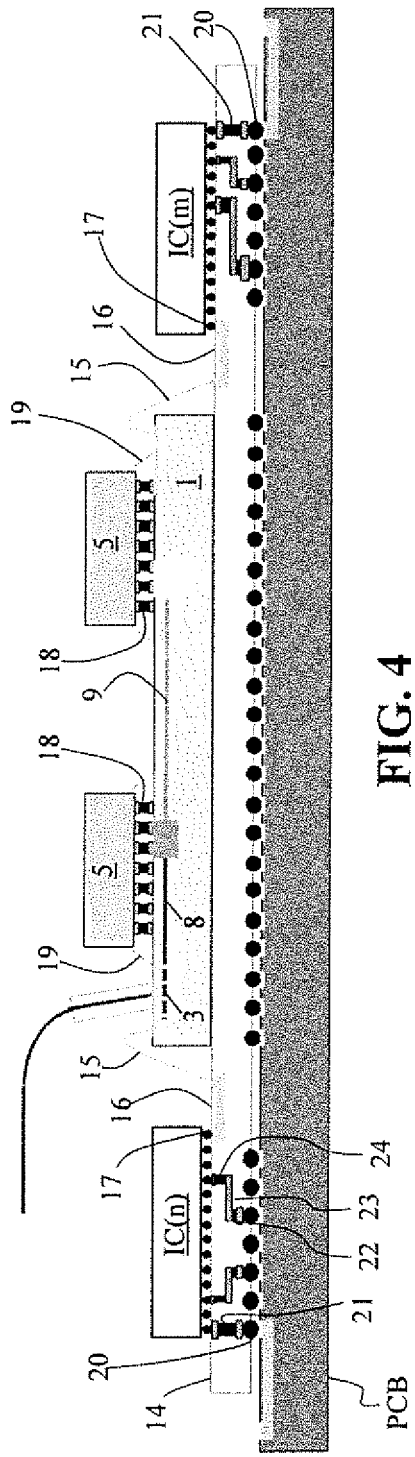
FIG. 4 is a schematic cross-sectional view of the general architecture of the electro-optical multi-substrate, multi-chip interconnection system of FIG. 3, with signal paths of interconnection of three hierarchically distinct levels, through the PCB, the multi-chip module primary substrate and the photonic waveguide fabric die of optical interconnection, respectively.

FIG. 4 is a schematic cross section of the general architecture of the electro-optical multi-substrate, multi-chip interconnection system of FIG. 3.

Electrical coupling between the integrated transceiver circuit dies 5 and the modulation devices 4 and photo detector diodes 6, integrated in the photonic waveguide fabric die 1, may be implemented with any of the commonly used techniques. The shown embodiment uses the copper pillar technique which forms copper pillars 18 by filling with copper contact vias through a resist layer atop the transceiver circuit die 5. This is followed by flip-chip bonding with a conductive adhesive of the ends of the copper pillars 18 onto correspondingly aligned metal pads of electrical connection to the modulation devices 4 and the photo detector diodes 6 on the surface of the photonic waveguide fabric die 1. A void filling thermosetting gel 19 ensures a stable mechanical bond.

Relatively short bond wire bridges 15 connect the metal strip lines 12 and 13 of I/O metal pads of the transceiver circuit dies 5 to respective metal strip lines 16 defined on the surface of the primary substrate 14. The metal strip lines 16 connect, through micro solder balls 17, with respective high frequency signal I/O bottom metal pads of the IC chips hosted on the module 14.

Figure 5:
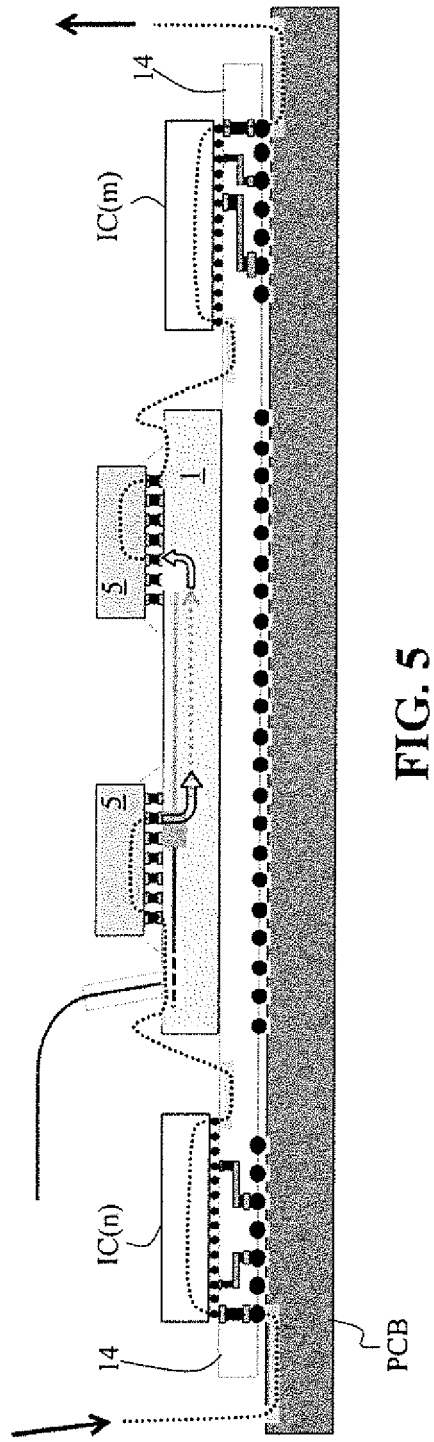
FIG. 5 illustrates a possible signal path, largely through the photonic waveguide fabric die, of high frequency signals to and from two distinct IC chips, hosted over the multi-chip module primary substrate of electrical interconnection.

The arrows at the two ends of the dotted line traced across the schematic sectional view of FIG. 5 indicate a possible signal path including a photonic interconnection for high frequency signals of two distinct IC chips.

The interconnection system of this disclosure provides for an efficient implementation of three hierarchically distinct levels of interconnections, respectively through the PCB, through the multi-chip module primary substrate 14 and through the photonic die 1 of optical interconnection.

The primary substrate of electrical interconnections 14 may be any appropriate material. Silicon (i.e., a purposely structured wafer) or other dielectric matrix materials, such as thermosetting resin (e.g., epoxy resins), glasses, ceramics and others may be used for making a suitably structured primary substrate of electrical interconnections 14. Typically, the dielectric matrix materials are used to fabricate substrates having several levels of purposely defined metal layers (as many as up to about 16 levels). The defined metal lanes of intermediate levels may be electrically connected through metal vias in the dielectric matrix material. In a test embodiment, a commercially available FR408 board was successfully used.

The module primary substrate 14 for a plurality of ICs has defined therein one or more intermediate level patterned metal layers besides top and bottom ones, and is electrically coupled to the supporting printed circuit board (PCB) through arrays of bumps 20 of thermally re-flown solder, according to common board mounting techniques.

Electrical paths between the hosted IC chips and the printed circuit in the PCB are realized through metal vias 21 across the full thickness of the primary substrate 14 or through metal vias 22 and defined portions 23 of an intermediate level metal, and metal vias 24 connecting to pad portions of the top level metal of the primary substrate 14.

The invention claimed is:

1. A system of intra-board, chip-to-chip communications for an electronic system comprising:
   at least one printed circuit board (PCB);
   at least one multi-chip module primary substrate comprising electrical interconnections electrically coupled to said at least one PCB and having a reserved area;
   a plurality of IC chips mounted side-by-side around the reserved area of said at least one multi-chip module primary substrate, with each IC chip electrically coupled to said at least one multi-chip module primary substrate via the electrical interconnections;
   a photonic waveguide silicon die mounted on the reserved area of said at least one multi-chip module primary substrate and to be optically coupled to at least one continuous wave laser source; and
   a plurality of integrated transceiver circuit dies mounted to peripheral portions of said photonic waveguide silicon die, side-by-side with said plurality of IC chips;
   said photonic waveguide silicon die comprising
      optical signal modulation devices and optical signal detection devices defined therein and under a footprint of said plurality of integrated transceiver circuit dies and coupled to a respective IC chip,
      at least one first optical waveguide network for distributing the continuous wave laser light to said optical modulation devices underneath said respective integrated transceiver circuit dies, and
      a second waveguide network for interconnecting an output of at least one of said optical modulation devices underneath a respective one of said plurality of integrated transceiver circuit dies to said optical signal detection devices of another one of said plurality of integrated transceiver circuit dies.

2. The system of claim 1, wherein said at least one multi-chip module primary substrate comprises:
   a dielectric matrix material comprising at least one of silicon, a thermosetting resin, glass, and ceramic;
   a plurality of metal vias in said dielectric matrix material; and
   a plurality of patterned metal layer levels electrically coupled through the metal vias in said dielectric matrix material.

3. The system of claim 1, wherein said second waveguide network comprises optical links to be coupled to optical I/O fibers for implementing inter-board communications among IC chips on different printed circuit boards (PCB) of the electronic system.

4. The system of claim 1, wherein each optical modulation device comprises at least one of a Mach-Zender interferometer, a ring resonator and an Electro-Absorption modulator.

5. The system of claim 1, wherein each optical signal detection device comprises a photodiode.

6. The system of claim 1, wherein each integrated transceiver circuit comprises:
   a driver circuit for respective optical modulation devices; and
   a trans-impedance amplifier for electrical signals generated by said optical signal detection devices.

7. An electro-optical interconnection system comprising:
   at least one printed circuit board (PCB);

at least one multi-chip module primary substrate comprising electrical interconnections electrically coupled to said at least one PCB;

a plurality of IC chips mounted on said at least one multi-chip module primary substrate, with each IC chip electrically coupled to said at least one multi-chip module primary substrate via the electrical interconnections;

a photonic waveguide silicon die mounted on said at least one multi-chip module primary substrate and to be optically coupled to at least one continuous wave laser source; and a plurality of integrated transceiver circuit dies mounted on said photonic waveguide silicon die, side-by-side with said plurality of IC chips;

said photonic waveguide silicon die comprising optical signal modulation devices and optical signal detection devices defined therein and under a footprint of said plurality of integrated transceiver circuit dies and coupled to a respective IC chip, at least one first optical waveguide network for distributing the continuous wave laser light to said optical modulation devices underneath said respective integrated transceiver circuit dies, and a second waveguide network for interconnecting an output of at least one of said optical modulation devices underneath a respective one of said plurality of integrated transceiver circuit dies to said optical signal detection devices of another one of said plurality of integrated transceiver circuit dies.

8. The electro-optical interconnection system of claim 7, wherein said at least one multi-chip module primary substrate comprises:

a dielectric matrix material comprising at least one of silicon, a thermosetting resin, glass, and ceramic;

a plurality of metal vias in said dielectric matrix material; and a plurality of patterned metal layer levels electrically coupled through the metal vias in said dielectric matrix material.

9. The electro-optical interconnection system of claim 7, wherein said second waveguide network comprises optical links to be coupled to optical I/O fibers for implementing inter-board communications among IC chips on different printed circuit boards (PCB) of the system.

10. The electro-optical interconnection system of claim 7, wherein each optical modulation device comprises at least one of a Mach-Zender interferometer, a ring resonator and an Electro-Absorption modulator.

11. The electro-optical interconnection system of claim 7, wherein each optical signal detection device comprises a photodiode.

12. The electro-optical interconnection system of claim 7, wherein each integrated transceiver circuit comprises:

a driver circuit for respective optical modulation devices; and a trans-impedance amplifier for electrical signals generated by said optical signal detection devices.

13. A method for making an electro-optical interconnection system comprising:

forming at least one printed circuit board (PCB);

forming at least one multi-chip module primary substrate comprising electrical interconnections electrically coupled to the at least one PCB;

mounting a plurality of IC chips on the at least one multi-chip module primary substrate, with each IC chip electrically coupled to the at least one multi-chip module primary substrate via the electrical interconnections;

mounting a photonic waveguide silicon die on the at least one multi-chip module primary substrate, with the photonic waveguide silicon die to be optically coupled to at least one continuous wave laser source; and mounting a plurality of integrated transceiver circuit dies on the photonic waveguide silicon die, side-by-side with the plurality of IC chips;

the photonic waveguide silicon die comprising optical signal modulation devices and optical signal detection devices defined therein and under a footprint of the plurality of integrated transceiver circuit dies and coupled to a respective IC chip, at least one first optical waveguide network for distributing the continuous wave laser light to the optical modulation devices underneath the respective integrated transceiver circuit dies, and a second waveguide network for interconnecting an output of at least one of the optical modulation devices underneath a respective one of the plurality of integrated transceiver circuit dies to the optical signal detection devices of another one of the plurality of integrated transceiver circuit dies.

14. The method of claim 13, wherein forming the at least one multi-chip module primary substrate comprises:

forming a dielectric matrix material comprising at least one of silicon, a thermosetting resin, glass, and ceramic;

forming a plurality of metal vies in the dielectric matrix material; and forming a plurality of patterned metal layer levels electrically coupled through the metal vias in the dielectric matrix material.

15. The method of claim 13, wherein the second waveguide network comprises optical links to be coupled to optical I/O fibers for implementing inter-board communications among IC chips on different printed circuit boards (PCB) of the system.

16. The method of claim 13, wherein each optical modulation device comprises at least one of a Mach-Zender interferometer, a ring resonator and an Electro-Absorption modulator.

17. The method of claim 13, wherein each optical signal detection device comprises a photodiode.

18. The method of claim 13, wherein each integrated transceiver circuit comprises:

a driver circuit for respective optical modulation devices; and a trans-impedance amplifier for electrical signals generated by the optical signal detection devices.

* * * * *